United States Patent
Toh et al.

(10) Patent No.: US 9,431,497 B2
(45) Date of Patent: Aug. 30, 2016

(54) TRANSISTOR DEVICES HAVING AN ANTI-FUSE CONFIGURATION AND METHODS OF FORMING THE SAME

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 51 days.

(21) Appl. No.: 13/899,150

(22) Filed: May 21, 2013

(65) Prior Publication Data

US 2014/0346603 A1    Nov. 27, 2014

(51) Int. Cl.
   *H01L 29/76*    (2006.01)
   *H01L 29/423*   (2006.01)
   (Continued)

(52) U.S. Cl.
   CPC ......... *H01L 29/42364* (2013.01); *G11C 17/16* (2013.01); *H01L 27/11206* (2013.01); *H01L 29/66795* (2013.01); *H01L 29/785* (2013.01); *H01L 21/8221* (2013.01); *H01L 23/5252* (2013.01); *H01L 27/0688* (2013.01); *H01L 27/10826* (2013.01); *H01L 27/10879* (2013.01); *H01L 27/1203* (2013.01); *H01L 2029/42388* (2013.01); *H01L 2924/0002* (2013.01)

(58) Field of Classification Search
   CPC .......... H01L 27/10826; H01L 29/66795; H01L 27/10879; H01L 27/1203; H01L 21/8221; H01L 27/0688
   USPC .......................................... 257/350
   See application file for complete search history.

(56) References Cited

U.S. PATENT DOCUMENTS

| 7,087,499 B2 | 8/2006 | Rankin et al. |
| 2007/0018237 A1* | 1/2007 | Kim et al. ..................... 257/324 |
| 2011/0195555 A1* | 8/2011 | Tsai et al. ..................... 438/301 |

FOREIGN PATENT DOCUMENTS

TW    201133760 A1    10/2011

OTHER PUBLICATIONS

2T Bitcell; Kilopass Technology, Inc.; 2011; Retrieved from the Internet on Apr. 4, 2013; <URL: http://www.kilopass.com/technology/2t-bitcell/>.

(Continued)

*Primary Examiner* — Wael Fahmy
*Assistant Examiner* — Tifney Skyles
(74) *Attorney, Agent, or Firm* — Ingrassia Fisher & Lorenz, P.C.

(57) ABSTRACT

Transistor devices having an anti-fuse configuration and methods of forming the transistor devices are provided. An exemplary transistor device includes a semiconductor substrate including a first fin. A first insulator layer overlies the semiconductor substrate and has a thickness less than a height of the first fin. The first fin extends through and protrudes beyond the first insulator layer to provide a buried fin portion and an exposed fin portion. A gate electrode structure overlies the exposed fin portion. A gate insulating structure is disposed between the first fin and the gate electrode structure. The gate insulating structure includes a first dielectric layer overlying a first surface of the first fin. The gate insulating structure further includes a second dielectric layer overlying a second surface of the first fin. A potential breakdown path is defined between the first fin and the gate electrode structure through the first dielectric layer.

20 Claims, 6 Drawing Sheets

(51) Int. Cl.
*H01L 27/112* (2006.01)
*G11C 17/16* (2006.01)
*H01L 29/66* (2006.01)
*H01L 29/78* (2006.01)
*H01L 27/06* (2006.01)
*H01L 27/108* (2006.01)
*H01L 27/12* (2006.01)
*H01L 21/822* (2006.01)
*H01L 23/525* (2006.01)

(56) References Cited

OTHER PUBLICATIONS

1T Bitcell; Kilopass Technology, Inc.; 2011; Retrieved from the Internet on Apr. 4, 2013; <URL: http://www.kilopass.com/technology/1t-bitcell/.

Intellectual Property Office, Examination Report for Taiwanese Patent Application No. 103104218 mailed Jun. 3, 2015.

\* cited by examiner

TRANSISTOR DEVICES HAVING AN ANTI-FUSE CONFIGURATION AND METHODS OF FORMING THE SAME

TECHNICAL FIELD

The technical field generally relates to transistor devices that have an anti-fuse configuration, and more particularly relates to FinFET transistor devices that have an anti-fuse configuration.

BACKGROUND

Anti-fuse technology is popular for use in one-time programmable (OTP) memory devices and can be employed to meet various non-volatile memory requirements of many applications while offering low power operation, low cost, and excellent reliability. Known anti-fuse technologies include 2T anti-fuse bitcells and split channel 1T anti-fuse bitcells.

The 2T anti-fuse bitcells include two core N-channel metal oxide semiconductor (NMOS) transistors. For the 2T anti-fuse bitcells, a program transistor (WLP) is generally coupled in series with a select transistor (WLR), with a bitline contact connected to a source region of the select transistor. When a normal supply voltage such as an I/O or core voltage is applied to the gates of the 2T anti-fuse bitcell, no current is sensed along the bitline. The equivalent circuit for the program transistor is a capacitor. Since there is no current that flows along the bitline, the bitcell is "0" by default. When a large programming voltage is applied along the gate of the program transistor, gate oxide breakdown occurs and a resistive path is created. The equivalent circuit for the program transistor becomes a resistor. A normal supply voltage applied to the gates of the 2T anti-fuse bitcell after programming result in current flow along the bitline and a "1" is sensed. The "1"s can be programmed at any time. Once it is programmed, it cannot be reverted back to a "0". Despite utility of the 2T anti-fuse bitcells, the two-transistor configuration is bulky and gate oxide breakdown along the gate of the program transistor is unpredictable and can occur at multiple locations. For example, gate oxide breakdown may occur in the channel of the program transistor or near the source region adjacent to the program transistor, thereby creating a bimodal distribution and raising reading error and reliability concerns.

The split channel 1T anti-fuse bitcells include a thin (core) gate and a thick (I/O) gate, with a bitline contact connected to a source region adjacent to the thick gate, with the thin gate being separated from the channel by a thinner gate dielectric layer than the thick gate. The thin gate is the program gate, while the thick gate is the select gate. When a normal supply voltage such as an I/O or core voltage is applied to the gates, no current is sensed along the bitline. The equivalent circuit is a capacitor. Since there is no current that flows along the bitline, the bitcell is "0" by default. When a large programming voltage is applied along the thin gate, a gate oxide breakdown occurs and a resistive path is created. The equivalent circuit for the thin gate is a resistor. Due to the thickness gradient, gate oxide breakdown occurs at the weakest link, which is the junction of the thick gate and thin gate. Despite enhanced controllability of gate oxide breakdown with the split cell 1T anti-fuse bitcells, the split cell 1T anti-fuse bitcells still have a large cell size and thick gate length is difficult to control during fabrication.

Accordingly, it is desirable to provide transistor devices that have an anti-fuse configuration and that are more compact than split cell 1T anti-fuse cells. Further, it is desirable to provide transistor devices that have an anti-fuse configuration and that enable gate oxide breakdown to be predictably controlled at specific locations within the transistor devices. Further still, it is desirable to provide transistor devices having an anti-fuse configuration that can be formed without the gate length control difficulties associated with split cell 1T anti-fuse bitcells. Furthermore, other desirable features and characteristics of the present invention will become apparent from the subsequent detailed description of the invention and the appended claims, taken in conjunction with the accompanying drawings and this background of the invention.

BRIEF SUMMARY

Transistor devices having an anti-fuse configuration and methods of forming the transistor devices are provided herein. In an embodiment, an exemplary transistor device includes a semiconductor substrate that includes a first fin. A first insulator layer overlies the semiconductor substrate and has a thickness less than a height of the first fin. The first fin extends through and protrudes beyond the first insulator layer to provide a buried fin portion that is embedded within the first insulator layer and an exposed fin portion that protrudes beyond the first insulator layer. A gate electrode structure overlies the exposed fin portion of the first fin. A gate insulating structure is disposed between the first fin and the gate electrode structure. The gate insulating structure includes a first dielectric layer that includes a breakdown dielectric material. The first dielectric layer overlies a first surface of the first fin. The gate insulating structure further includes a second dielectric layer that is different from the first dielectric layer. The second dielectric layer overlies a second surface of the first fin. A potential breakdown path is defined between the first fin and the gate electrode structure through the first dielectric layer.

In another embodiment, an exemplary transistor device includes a semiconductor substrate that includes a first fin and a second fin. A first insulator layer overlies the semiconductor substrate and has a thickness less than a height of the first fin and the second fin. The first fin and the second fin extend through and protrude beyond the first insulator layer to provide buried fin portions that are embedded within the first insulator layer and exposed fin portions that protrude beyond the first insulator layer. A gate electrode structure overlies the exposed fin portions of the first fin and the second fin. Gate insulating structures are disposed between the first fin and the gate electrode structure and between the second fin and the gate electrode structure. The gate insulating structures include a first dielectric layer that includes a breakdown dielectric material. The first dielectric layer overlies a first side of the respective fins. The gate insulating structures further include a second dielectric layer that is different from the first dielectric layer. The second dielectric layer overlies a second side of the respective fins. The first dielectric layer is thinner than the second dielectric layer to provide a potential breakdown path between the respective fins and the gate electrode structure through the first dielectric layer. The second dielectric layer is absent from the potential breakdown path that is defined between the respective fins and the gate electrode structure through the first dielectric layer.

In another embodiment, a method of forming a transistor device that has an anti-fuse configuration includes providing a semiconductor substrate that includes a first fin. A first insulator material is deposited overlying the semiconductor substrate. The first insulator material is etched to form a first insulator layer that has a thickness that is less than a height of the first fin. The first fin extends through and protrudes beyond the first insulator layer to provide a buried fin portion that is embedded within the first insulator layer and an exposed fin portion that protrudes beyond the first insulator layer. A first dielectric layer that includes a breakdown dielectric material is formed over a first surface of the first fin. A second dielectric layer is formed over a second surface of the first fin. The second dielectric layer is different from the first dielectric layer. A gate electrode structure is formed over the first dielectric layer and the second dielectric layer with a potential breakdown path defined between the first fin and the gate electrode structure through the first dielectric layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
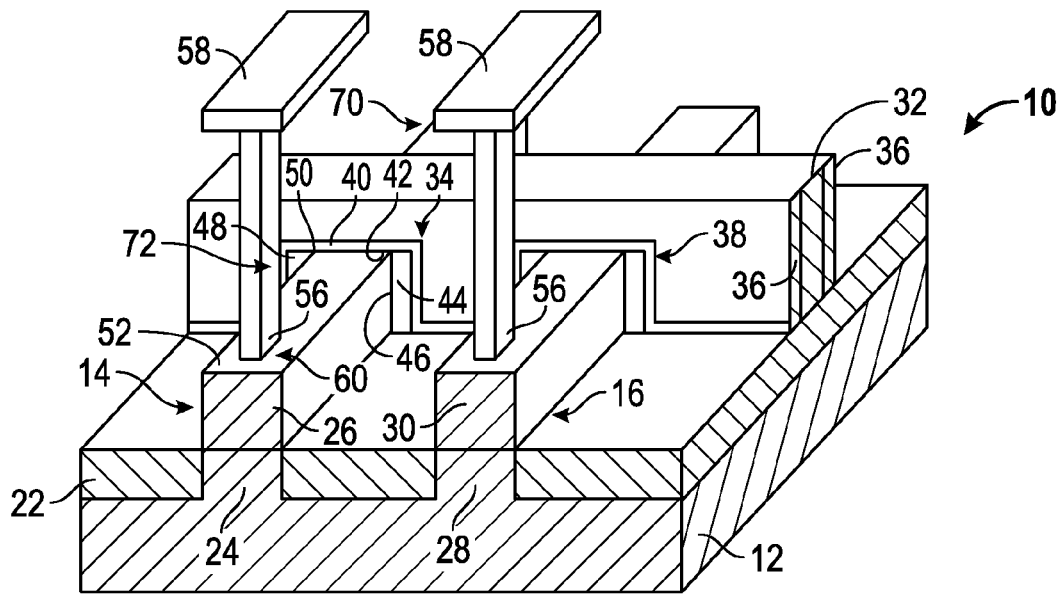
FIG. 1 is a schematic perspective view of a portion of a transistor device in accordance with an embodiment.

The following detailed description is merely exemplary in nature and is not intended to limit the various embodiments or the application and uses thereof. Furthermore, there is no intention to be bound by any theory presented in the preceding background or the following detailed description.

Transistor devices that have an anti-fuse configuration and methods of forming the transistor devices are provided herein. Anti-fuse configurations, as referred to herein, refer to a programmable circuit design that incorporates an element that initially has a high resistance and is designed to permanently create an electrically conductive path, typically when an applied voltage across the element exceeds a certain level. The transistor devices described herein include a gate electrode structure that overlies a first fin of a semiconductor substrate, with a gate insulating structure configured to provide an anti-fuse unit cell and disposed between the first fin and the gate electrode structure. In particular, the gate insulating structure 34 includes a first insulating layer that includes a breakdown dielectric material and that overlies a first surface of the first fin. The gate insulating structure also includes a second dielectric layer that is different from the first dielectric layer and that overlies a second surface of the first fin. A potential breakdown path is defined between the first fin and the gate electrode structure through the first dielectric layer. The second dielectric layer resists gate dielectric breakdown and, in various embodiments, functions as a selector gate within the anti-fuse configuration. The anti-fuse configurations described herein are less bulky than split cell 1T anti-fuse cells and 2T anti-fuse cells due to the arrangement of the first dielectric layer and the second dielectric layer on the first fin. Further, gate oxide breakdown in the potential breakdown path of the transistor devices described herein may be predictably controlled at specific locations within the transistor devices. For example, while the potential breakdown path is defined between the first fin and the gate electrode structure through the first dielectric layer, a higher chance of breakdown exists at corners where the first dielectric layer and the second dielectric layer meet. In particular, the first dielectric layer may overlay a first side of the first fin, and the second dielectric layer may overlay a second side of the first fin, e.g., the first side and the second side of the first fin may be generally transverse to each other with the first dielectric layer disposed transverse to the second dielectric layer. In this manner, a higher chance of potential breakdown may exist at corners of the first fin, i.e., at intersections of the first side and the second side, which provide highly controllable potential breakdown paths. Further, in embodiments where the first dielectric layer overlies a first side of the first fin, and the second dielectric layer overlies the second side of the first fin, the anti-fuse configuration can be formed without gate length control difficulties associated with split cell 1T anti-fuse bitcells.

Figure 2:
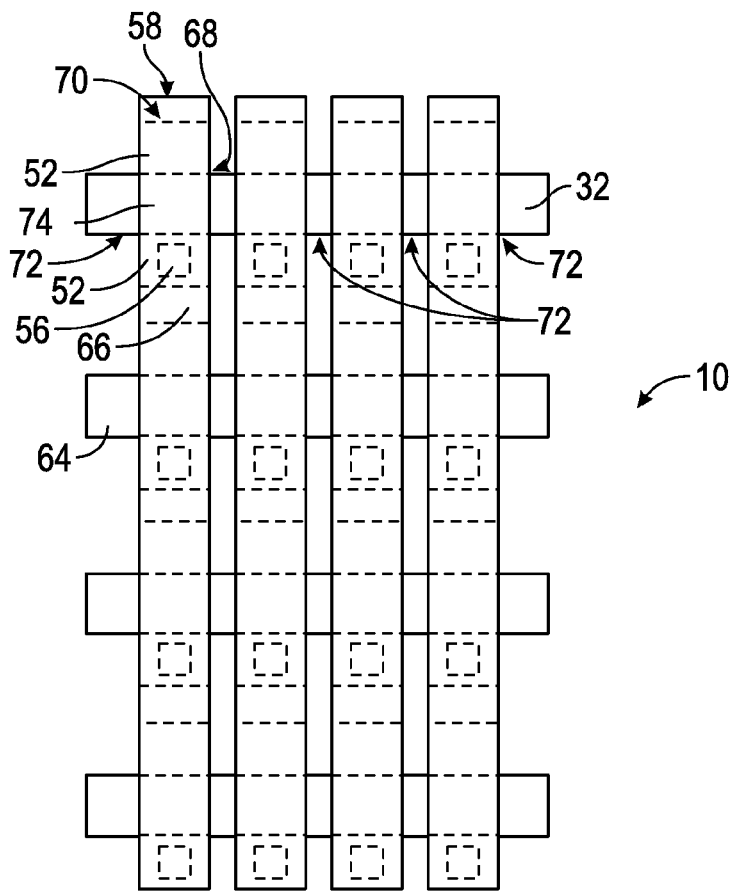
FIG. 2 is a schematic top view of the transistor device shown in FIG. 1.
Figure 3:
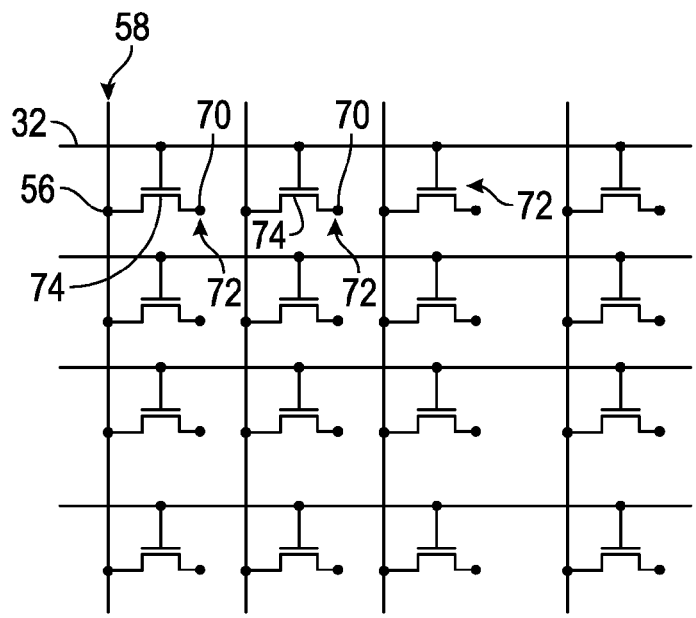
FIG. 3 is a programmable circuit design for the transistor device that is shown in FIG. 2.

An exemplary embodiment of a transistor device 10 that has an anti-fuse configuration will now be described with reference to FIGS. 1-3, with FIG. 1 providing a perspective view of a portion of the transistor device 10 that is shown in FIG. 2 and with FIG. 3 representing a programmable circuit design for the transistor device 10 that is shown in FIG. 2. Referring to FIG. 1, the transistor device 10 includes a semiconductor substrate 12 that includes a first fin 14. As also shown in the embodiment of FIG. 1, the semiconductor substrate 12 further includes a second fin 16 that extends parallel to the first fin 14. Referring momentarily to FIG. 2, it is to be appreciated that the semiconductor substrate 12 may include a plurality of fins 14, 16, 18, 20 in accordance with conventional FinFET technology, with the plurality of fins 14, 16, 18, 20 extending parallel to each other. Without intending to be limiting, the fins may have a width on the nanometer scale, such as from about 5 to about 30 nm, although the transistor devices 10 and methods described herein are not limited to any particular dimensional constraints. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIG. 1, the semiconductor substrate 12 is a bulk silicon wafer with the first fin 14 formed in the bulk silicon wafer. However, it is to be appreciated that in other embodiments and although not shown in the Figures, the semiconductor substrate may include a silicon-containing material that is disposed on an insulating material, commonly known as a silicon-on-insulator (SOI) structure that, in turn, may be supported by a support substrate. In an embodiment, the semiconductor substrate 12 is doped with a P-type dopant such as, but not limited to, boron, aluminum, gallium, indium, and combinations thereof, thereby forming a well for the transistor device 10. The semiconductor substrate 12 can be doped, for example, by ion implantation prior to or after forming the first fin 14 in or on the semiconductor substrate 12. Multiple ion implantation steps may be used to achieve the desired dopant concentration and profile.

In an embodiment and as shown in FIG. 1, a first insulator layer 22 overlies the semiconductor substrate 12 and has a thickness that is less than a height of the first fin 14 such that the first fin 14 extends through and protrudes beyond the first insulator layer 22 to provide a buried fin portion 24 that is embedded within the first insulator layer 22 and an exposed fin portion 26 that protrudes beyond the first insulator layer 22. In an embodiment and as shown in FIG. 1, the second fin 16 has a second buried fin portion 28 and a second exposed fin portion 30. Although not shown, it is to be appreciated that any additional fins likewise have buried fin portions and exposed fin portions. The first insulator layer 22 includes a first insulator material. The first insulator material is not particularly limited and may include any insulating material such as, but not limited to, an oxide including silicon dioxide or a nitride such as silicon nitride.

A gate electrode structure 32 overlies the exposed fin portion 26 of the first fin 14 and is electrically insulated from the fin 14 by a gate insulating structure 34, with the gate insulating structure 34 configured to provide the anti-fuse configuration to the transistor device 10 as described in further detail below. In an embodiment and as shown in FIG. 1, sidewall spacers 36 are disposed along sidewalls of the gate electrode structure 32. In an embodiment and as shown in FIG. 1, the gate electrode structure 32 further overlies the second exposed fin portion 30 of the second fin 16. Through the aforementioned arrangement of the gate electrode structure 32 and the fins 14, 16, the gate electrode structure 32 may be designed to function as a word line with the fins 14, 16 functioning as bit lines in a programmable circuit design as described in further detail below and as shown in FIGS. 2 and 3.

Referring again to FIG. 1 and as alluded to above, the gate insulating structure 34 is disposed between the first fin 14 and the gate electrode structure 32 and is configured to provide the anti-fuse configuration to the transistor device 10. Additional gate insulating structures 38 may be provided for additional fins, including the second fin 16 as described above, although the gate insulating structures will be hereinafter described in the context of the first fin 14 only for simplicity. The gate insulating structure 34 includes a first dielectric layer 40 overlying a first surface 42 of the first fin 14. The gate insulating structure 34 further includes a second dielectric layer 44 that is different from the first dielectric layer 40 and that overlies a second surface 46 of the first fin 14. The second dielectric layer 44 is different from the first dielectric layer 40 in at least one of material composition or thickness to isolate a potential breakdown path between the first fin 14 and the gate electrode structure 32 through the first dielectric layer 40 only, and not through the second dielectric layer 44. As referred to herein, a potential breakdown path refers to a path where dielectric breakdown will occur first when a programming current is passed from the first fin 14 to the gate electrode structure 32 through the first dielectric layer 40. The second dielectric layer 44 provides electrical insulation between the first fin 14 and the gate electrode structure 32, even after gate dielectric breakdown occurs in the first dielectric layer 40. The second dielectric layer 44 resists breakdown path formation, at least under conditions that result in breakdown path formation through the first dielectric layer 40, and maintains insulating properties even after gate dielectric breakdown occurs in the first dielectric layer 40.

The first dielectric layer 40 includes a breakdown dielectric material. Breakdown dielectric material, as described herein, is any dielectric material that initially electrically insulates the first fin 14 from the gate electrode structure 32 under electrical current at a reading voltage, but that is capable of undergoing gate dielectric breakdown to form a resistive path between the first fin 14 and the gate electrode structure 32 upon the application of a programming voltage that is higher than the reading voltage. Suitable breakdown dielectric materials include, but are not limited to, high-k dielectric materials such as $HfO_2$ and HfAlO; oxides such as silicon oxides; nitrides such as silicon nitrides; silicon oxynitrides; and the like. Thickness of the first dielectric layer 40 also impacts gate dielectric breakdown, with thinner first dielectric layers 40 being more susceptible to gate dielectric breakdown than thicker dielectric layers. In an embodiment, the first dielectric layer 40 is thinner than the second dielectric layer 44 to provide the potential breakdown path defined between the first fin 14 and the gate electrode structure 32 through the first dielectric layer 40. In embodiments, the first dielectric layer 40 has a thickness of from about 1 nm to about 20 nm, such as from about 2 nm to about 10 nm.

The first surface 42 of the first fin 14 over which the first dielectric layer 40 is disposed is not particularly limited and may be any surface of the first fin 14 where gate dielectric breakdown can occur through flow of current between the first fin 14 and the gate electrode structure 32 through the first dielectric layer 40. In an embodiment, the first surface 42 is further defined as a surface of the first fin 14 having defined boundaries, e.g., corners or jogs in the surface of the first fin 14, to enable predetermined definition of a width of the first dielectric layer 40. In embodiments, the first surface 42 over which the first dielectric layer 40 is disposed is an entire side of the first fin 14 for purposes of defining precise dimensions of the first dielectric layer 40, which enables predictable locations for gate dielectric breakdown to be controlled. In an embodiment and as shown in FIG. 1, the first surface 42 over which the first dielectric layer 40 is disposed is a top side of the first fin 14, with the first dielectric layer 40 disposed continuously over a width of the top side of the first fin 14 at locations between the first fin 14 and the gate electrode structure 32. In other embodiments and referring momentarily to FIG. 16, the first surface 142 over which the first dielectric layer 140 is disposed is a side surface of the first fin 14.

The second dielectric layer 44 includes any dielectric material including high k and ultra-high k materials, and the dielectric material of the second dielectric layer 44 is not limited provided that the second dielectric layer 44 still provides electrical insulation even after gate dielectric breakdown of the first dielectric layer 40. Specific dielectric materials that are suitable for the second dielectric layer 44 include, but are not limited to, oxides such as silicon oxides, nitrides such as silicon nitrides, and oxynitrides such as silicon oxynitride. The second dielectric layer 44 may be thicker than the first dielectric layer 40 to resist gate dielectric breakdown during programming of the transistor device 10, although it is to be appreciated that the second dielectric layer 44 need not necessarily be thicker than the first dielectric layer 40 so long as the second dielectric layer 44 still resists gate dielectric breakdown during programming of the transistor device 10. In embodiments, the second dielectric layer 44 has a thickness of from about 1 nm to about 50 nm, such as from about 3 nm to about 10 nm.

The second surface 46 of the first fin 14 over which the second dielectric layer 44 is disposed includes any surface of the first fin 14 that is free of the first dielectric layer 40. In embodiments, the second surface 46 of the first fin 14 over which the second dielectric layer 44 is disposed is an entire side of the first fin 14. In an embodiment and as shown in FIG. 1, the second surface 46 over which the first dielectric layer 40 is disposed is a sidewall of the first fin 14, which is generally transverse to the top side of the first fin 14, with the second dielectric layer 44 disposed over the entire sidewall of the first fin 14 between the first fin 14 and the gate electrode structure 32. In this embodiment, another portion 48 of the second dielectric layer 44 may be disposed over a third surface 50 of the first fin 14. For example, as shown in FIG. 1, the other portion 48 of the second dielectric layer 44 may be disposed on another sidewall of the first fin 14 to provide electrical insulation on both sides of the first fin 14. In other embodiments and referring momentarily to FIG. 16, the second surface 146 over which the second dielectric layer 144 is disposed is a top surface 146 of the first fin 14.

The first dielectric layer 40 may be oriented relative to the second dielectric layer 44 in various configurations to define the potential breakdown path between the first fin 14 and the gate electrode structure 32 therethrough. Potential breakdown paths may be focused at corners or jogs in the surfaces of the first fin 14 to provide precise locations of the potential breakdown paths, although it is possible for potential breakdown paths to be defined at other locations along the first surface 42. In an embodiment and referring again to FIG. 1, the first dielectric layer 40 is disposed transverse to the second dielectric layer 44, thereby clearly defining the potential breakdown path from regions that are to remain insulated. To enable the potential breakdown path to be precisely defined, in an embodiment, the second dielectric layer 44 is absent from the potential breakdown path that is defined between the first fin 14 and the gate electrode structure 32 through the first dielectric layer 40. In particular, the second dielectric layer 44 is absent from all linear paths between the first fin 14 and the gate electrode structure 32 through the first dielectric layer 40. Further, to enable gate dielectric breakdown to occur, the first dielectric layer 40 is the only dielectric layer disposed between the first surface 42 of the first fin 14 and the gate electrode structure 32, without other dielectric layers disposed between the first surface 42 of the first fin 14 and the gate electrode structure 32. Because over-insulation in the regions of the second dielectric layer 44 is not a concern, the first dielectric layer 40 may at least partially overlap (and may completely overlay) the second dielectric layer 44 as shown in FIG. 1. In other embodiments and referring momentarily to FIG. 10, the first dielectric layer 240 may be absent from over the second dielectric layer 244, and such configuration may be dependent upon a manner by which the transistor device 10 is formed as described in further detail below.

Referring again to FIG. 1, in an embodiment, the first fin 14 includes a doped region 52 of semiconductor material in the exposed fin portion 26, adjacent to the gate insulating structure 34. The doped region 52 of semiconductor material may be doped with N-type dopants such as, but not limited to, phosphorus, arsenic, antimony, and combinations thereof. The exposed fin portion 26 of the first fin 14 can be doped, for example, by ion implantation prior to or after forming the first fin 14 in or on the semiconductor substrate 12. Multiple ion implantation steps may be used to achieve the desired dopant concentration and profile in accordance with conventional source/drain region formation for Fin-FETs. In an embodiment and as shown in FIG. 2, the doped region 52 of semiconductor material is interrupted by unaltered semiconductor material (not shown) of the first fin 14 along a length thereof from one side of the gate insulating structure 34 to another side of the gate insulating structure 34. By "unaltered semiconductor material", it is meant that referenced semiconductor material is not doped during ion implantation to produce the doped region 52 of semiconductor material, although the unaltered semiconductor material is generally doped with other dopants such as P-type dopants as described above. For example, in this embodiment, ion implantation is conducted after formation of the gate electrode structure 32, which shields portions of the first fin 14 during ion implantation to result in the unaltered semiconductor material that interrupts the doped region 52 of semiconductor material along the length of the first fin 14.

In an embodiment and as shown in FIG. 1, the transistor device 10 further includes a bit line connection 56 that is connected to a bit line 58 and that is in electrical communication with the doped region 52 of semiconductor material in the exposed fin portion 26 to form a connected source region 60. In an embodiment and as shown in FIG. 2, at least one additional gate electrode structure 64 overlies the exposed fin portion 26 of the first fin 14, and all gate electrode structures that overlying the first fin 14 are separated through a trench isolation structure 66 in the first fin 14. In this embodiment, the intersection 68 of the gate electrode structure 32 with the first fin 14 includes doped regions 52 of semiconductor material in the exposed fin portion 26 on either side of the gate electrode structure 32, with the bit line connection 56 in electrical communication with the doped region 52 of semiconductor material for the intersection 68 to form the connected source region 60 and with a drain region 70 floated without a bit line drain connection. The trench isolation structures 66 are formed in the first fin 14 to electrically isolate the doped regions 52 of semiconductor material between adjacent gate electrode structures 32, 64, thereby forming an array of transistors 72 having the anti-fuse configuration. In an embodiment and as shown in FIG. 2, the semiconductor substrate 12 includes the plurality of fins 14, 16, 18, 20 in accordance with conventional FinFET technology, and each fin 14, 16, 18, 20 has the gate electrode structures 32, 64 traversing it. In another embodiment and although not shown, an alternative configuration is possible where a common floating drain region is disposed in the first fin between adjacent gate electrodes, with the bit line connection in electrical communication with the doped region of semiconductor material on an opposite side of each gate electrode from the common floating drain region to form the connected source regions. Such alternative configuration including the common floating drain may provide further space saving features to the integrated circuits.

Referring to FIG. 3, a programmable circuit design is shown for the transistor device 10 that is shown in FIG. 2. In particular, the array of transistors 72 of FIG. 2 is shown, with floating drain regions 70, bit line connections 56 that are connected to the bit line 58, and potential breakdown paths 74 shown for each transistor 72 in the array. When a normal supply voltage such as an I/O or core voltage is applied to the potential breakdown paths 74 prior to programming, no current is sensed at the gate electrode structure 32 because, referring to FIG. 1, the first dielectric layer 40 insulates the first fin 14 from the gate electrode structure 32. Since there is no current that flows between the first fin 14 and the gate electrode structure 32, the transistor 72 has a "0" value by default. To program the transistors 72, a high current is passed between the first fin 14 and the gate electrode structure 32 through the first dielectric layer 40 at a programming voltage, with the first dielectric layer 40 experiencing dielectric breakdown to form a resistive path. In particular, gate oxide breakdown occurs at the weakest link in the gate insulating structure 34, which is controlled with configurations of the first dielectric layer 40 and the second dielectric layer 44 as described above. Upon applying a reading voltage after gate dielectric breakdown has occurred in the first dielectric layer 40, a high current can be detected to the gate electrode structure 32 whereas low current is detected when no gate dielectric breakdown has occurred.

Figure 4:
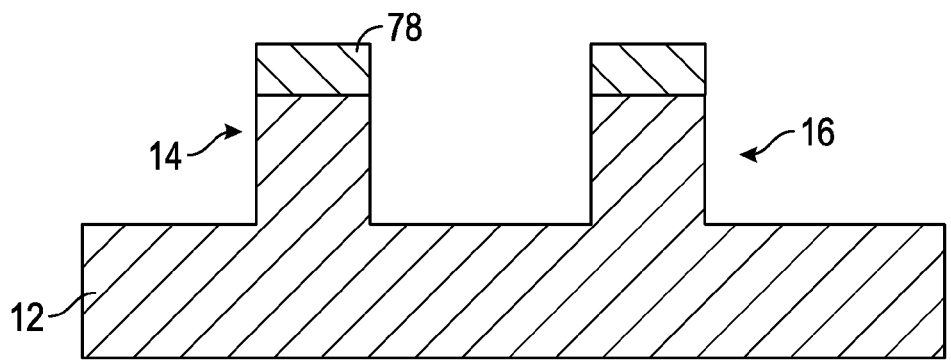
FIGS. 4-9 illustrate, in cross section, a method of forming a portion of a transistor device as shown in FIGS. 1 and 2 in accordance with an exemplary embodiment.

An exemplary method of forming the transistor device 10 of FIGS. 1 and 2 will now be described with reference to FIGS. 4-9. Referring to FIG. 4, a semiconductor substrate 12 is provided that includes a first fin 14. In an embodiment, the first fin 14 is first formed in the semiconductor substrate 12 through conventional techniques, such as by forming a hard mask 78 over a top surface of the semiconductor substrate 12 and patterning a photoresist (not shown) over the hard mask 78 to form a patterned mask (not shown) in a configuration of the first fin 14 and any additional fins to be formed. The hard mask 78 and semiconductor substrate 12 are etched through recesses in the patterned mask, thereby resulting in the configuration shown in FIG. 4.

Figure 5:
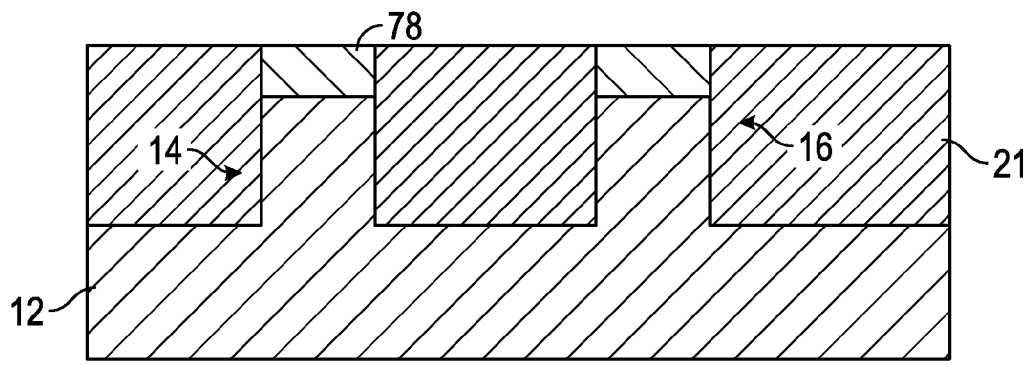

Referring to FIG. 5, the first insulator material 21 is deposited overlying the semiconductor substrate 12, followed by planarizing the first insulator material 21 onto even plane with an upper surface of the hard mask 78 over the fins 14, 16. In this manner, a planar surface of the first insulator material 21 can be established in anticipation of etching the first insulator material 21.

Figure 6:
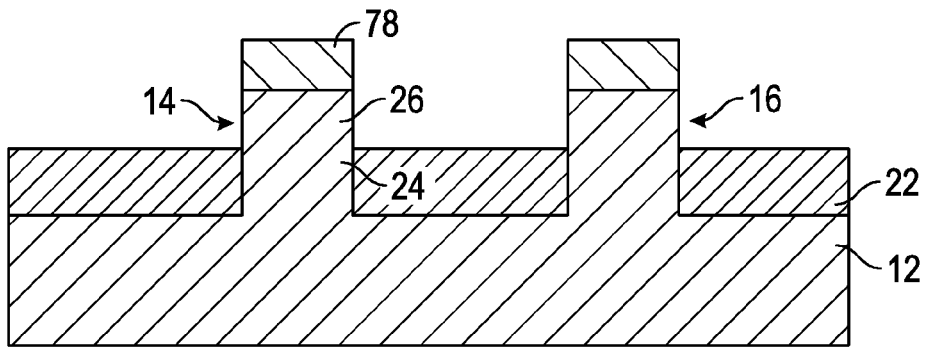

In an embodiment and as shown in FIG. 6, the first insulator material is etched to form the first insulator layer 22 that has the thickness less than the height of the first fin 14, with the first fin 14 extending through and protruding beyond the first insulator layer 22 to provide the buried fin portion 24 that is embedded within the first insulator layer 22 and the exposed fin portion 26 that protrudes beyond the first insulator layer 22. Etching may be conducted using an appropriate etchant for the particular first insulator material, e.g., an oxide etchant such as dilute HF and heated $H_3PO_4$ solutions with water for etching silicon oxides and silicon nitrides, respectively.

Figure 7:
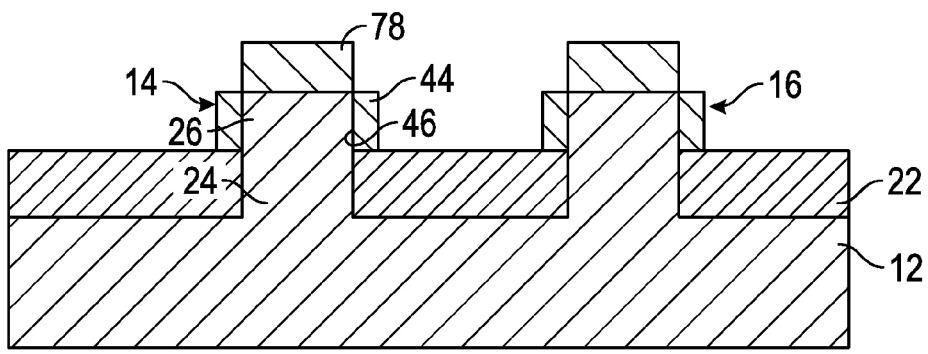

In an embodiment and as shown in FIG. 7, the second dielectric layer 44 is formed over sidewalls of the first fin 14. In particular, dielectric material of the second dielectric layer 44 may be deposited over the first insulator layer 22 and the first fin 14, including over the hard mask 78 that is disposed over the first fin 14, followed by etching the dielectric material of the second dielectric layer 44 that is disposed on horizontal surfaces, thereby leaving the second dielectric layer 44 disposed over the sidewalls of the first fin 14 and any other fins. Alternatively, the second dielectric layer 44 may be formed through epitaxially growth on the sidewalls of the first fin 14 and any other fins, with growth restricted to the sidewalls of the first fin 14 and any other fins due to the presence of the hard mask 78 over the first fin 14 and further due to the presence of the first insulator layer 22 over the semiconductor substrate 12.

Optionally, although not shown, a dummy gate may be formed over the hard mask 78, the second dielectric layer 44, and the first insulator layer 22. The dummy gate may be formed from polycrystalline or amorphous silicon and enables conventional front-end-of-line (FEOL) logical FinFET processing, including doping the first fin 14 to form the source/drain regions, and bitline/well tap formation to form the connected source region while shielding locations where gate electrode structures are to be formed. Alternatively, it is to be appreciated that the methods described herein may be conducted through a gate-first technique, where the gate electrode structure 32 is formed prior to FEOL logical FinFET processing and bitline/well tap formation, in which case no dummy gate is formed. Although not shown in the Figures, in the embodiment of the method shown in FIGS. 4-9, in the gate-first technique, sidewall spacers may be formed adjacent to the gate electrode structure 32 and the exposed fin portion 26 of the first fin 14 can be doped as part of the FEOL logical FinFET processing, for example, by ion implantation after forming the first fin 14 and after forming the gate electrode structure 32 and sidewall spacers. In this embodiment, the gate electrode structure 32 and sidewall spacers shield portions of the first fin 14 during ion implantation, thereby resulting in regions of unaltered semiconductor material interrupting doped regions 52 of semiconductor material.

Figure 8:
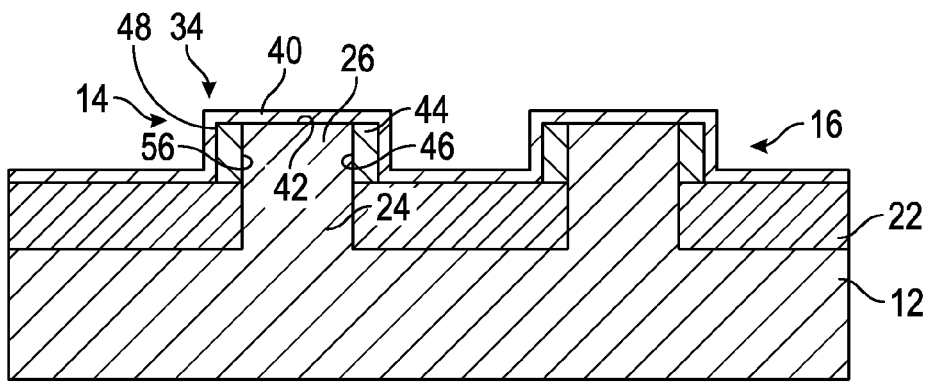

In an embodiment and as shown in FIG. 8, the hard mask 78 is removed from over the first fin 14 and any additional fins, such as by etching using an appropriate etchant, and the first dielectric layer 40 is formed over the first fin 14 and the second dielectric layer 44 that disposed on the sidewalls of the first fin 14. In particular, the breakdown dielectric material of the first dielectric layer 40 may be conformally deposited over the first fin 14 and any additional fins, over the second dielectric layer 44, and the first insulator layer 22 to result in the configuration shown in FIG. 8.

Figure 9:
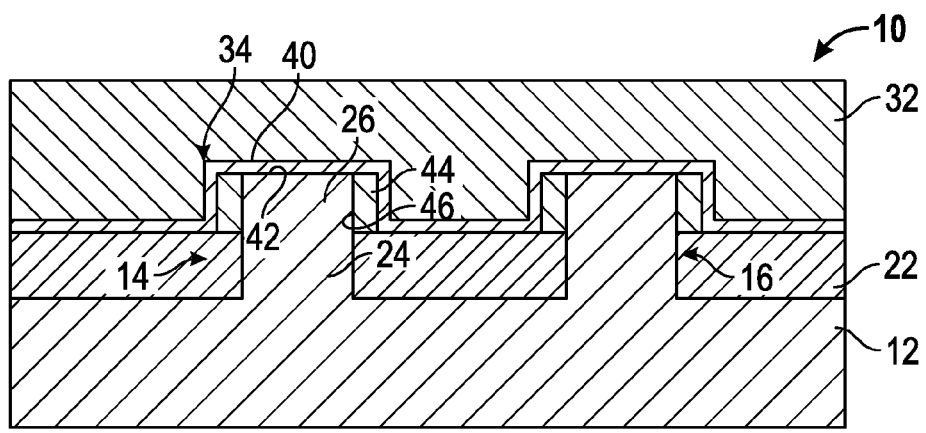

After forming the first dielectric layer 40 and as shown in FIG. 9, a gate electrode structure 32 is formed over the first dielectric layer 40 and the second dielectric layer 44 with a potential breakdown path defined between the first fin 14 and the gate electrode structure 32 through the first dielectric layer 40. Although not shown in FIG. 9, additional gate electrode structures may be formed to produce the array shown in FIG. 2. In an embodiment and as shown in FIG. 1, the gate electrode structure 32 wraps around the exposed fin portion 26, on three sides thereof, in accordance with conventional FinFET technology. In particular the gate electrode structure 32 is disposed over the first dielectric layer 40 and the second dielectric layer 44, which insulate the first fin 14 from the gate electrode structure 32.

Figure 10:
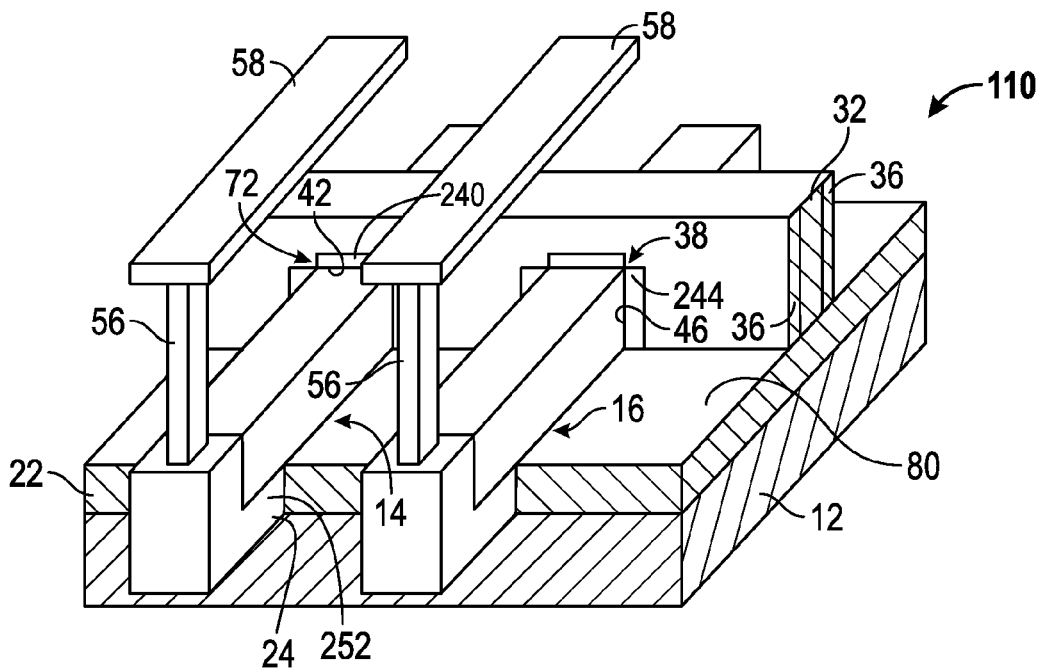
FIG. 10 is a schematic perspective view of a portion of a transistor device in accordance with an alternative embodiment.

Another embodiment of a transistor device 210 will now be described with reference to FIG. 10. In this embodiment, alternative configurations of the transistor device 210 from the embodiment of FIG. 1 are shown, including a different configuration for the first dielectric layer 240 and for the doped region 252 of semiconductor material. All remaining structures of the transistor device 210 are the same as described above for the embodiment of FIG. 1. In this embodiment and as shown in FIG. 10, the first dielectric layer 240 is absent over the second dielectric layer 244. In particular, whereas the first dielectric layer 40 in the embodiment of FIG. 1 overlaps the second dielectric layer 44, the first dielectric layer 240 and the second dielectric layer 244 do not overlap in the embodiment of FIG. 10. The absence of the first dielectric layer 240 over the second dielectric layer 244 does not materially impact operation of the transistor device 210, although the presence of the first dielectric layer 240 over the second dielectric layer 244 may provide additional insulation properties to the second dielectric layer 244 in the embodiment of FIG. 1. In the embodiment of FIG. 10, the absence of the first dielectric layer 240 over the second dielectric layer 244 is primarily a result of the manner by which the transistor device 210 of this embodiment is made as described in further detail below.

As set alluded to above, in the embodiment of FIG. 10 the configuration for the doped region 252 of semiconductor material is different from that of the embodiment of FIG. 1. In particular, the doped region 252 of semiconductor material is disposed in the buried fin portion 24 of the first fin 14, below the plane of an exposed surface 80 of the first insulator layer 22. In this embodiment, the doped region 252 of semiconductor material extends uninterrupted along a length of the first fin 14 from one side of the gate insulating structure 34 to another side of the gate insulating structure 34, and the doped region 252 of semiconductor in the buried fin portion 24 may provide further opportunities for decrease in dimension size of the transistors 72 because individual connected source regions 60 are not necessary for each transistor 72. Rather, a bit line connection 56 is in electrical communication with the doped region 52 of semiconductor material to form a connected source region 60 for the first fin 14. As such, the bit line connection 56 is effective to provide electrical current at a single location for all transistors 72 formed along the first fin 14, with the doped region 252 of semiconductor material that is immediately underlying the first dielectric layer 240 for each transistor 72 serving as the source region and with no drain region in this embodiment. It is to be appreciated that the configuration of the gate insulating structure 34 as shown in FIG. 1 can also apply to the configuration of the doped region 252 of semiconductor in the buried fin portion 24 as shown in FIG. 10. In this embodiment, the sidewall of the first fin 14, which has the second dielectric layer 244, may function as a selector gate within the anti-fuse configuration due to the location of the doped region 252 of semiconductor material being located in the buried fin portion 24. To explain, the second dielectric layer 244 functions as a gate insulator for the select transistor in a similar manner to a convention 1T cell. Once a program voltage is applied, the sidewall of the first fin 14 as a selector gate such that an inversion layer is formed, connecting it to the first dielectric layer 240, where dielectric breakdown occurs. This is the same for reading 0 or 1, whereby the inversion layer is formed that connects to the first dielectric layer 240 that acts either as a capacitor or a resistor, depending upon whether dielectric breakdown has occurred.

Figure 11:
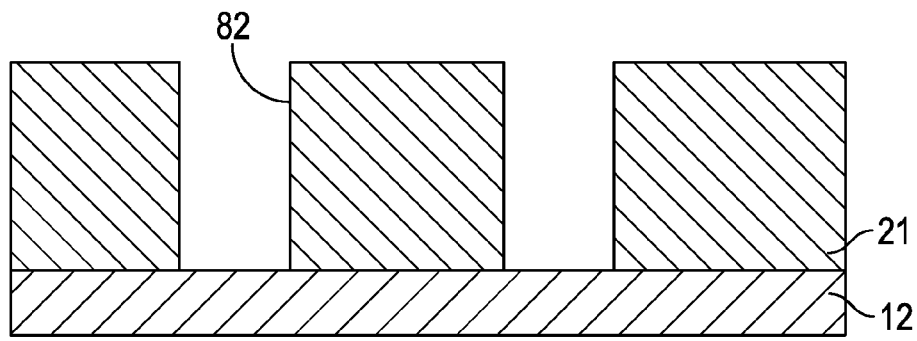
FIGS. 11-15 illustrate, in cross section, a method of forming a portion of a transistor device as shown in FIG. 10 in accordance with an exemplary embodiment.

Referring to FIGS. 12-16, an embodiment of a method of forming the transistor device 210 of FIG. 10 will now be described. In this embodiment and as shown in FIG. 11, a semiconductor substrate 12 is first provided in anticipation of forming the first fin 14. The first insulator material 21 is deposited overlying the semiconductor substrate 12, followed by patterning the first insulator material 21 with recesses 82 in a configuration of fins to be formed on the semiconductor substrate 12.

Figure 12:
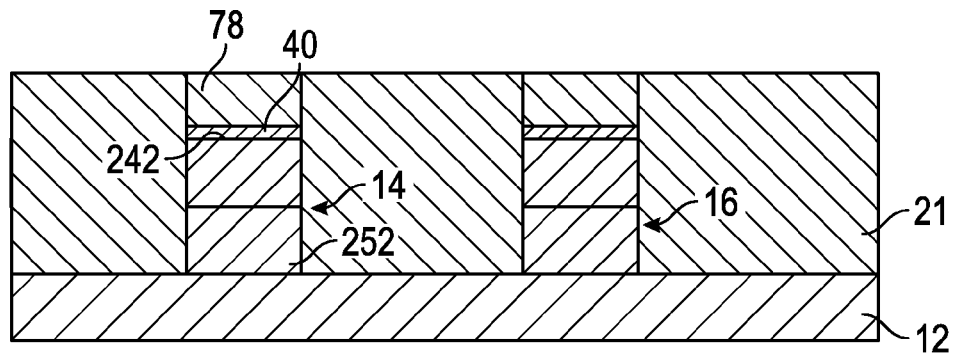

Referring to FIG. 12, the first fin 14 and any additional fins are formed in the recesses within the first insulator material 21. In particular, the doped region 252 of semiconductor material is first formed, followed by deposition of semiconductor material that is to become the exposed fin portion 26 and which is either undoped or doped with P-type dopant, followed by formation of the first dielectric layer 240 over the exposed fin portion 26. A hard mask 78 is then formed over the first dielectric layer 240.

Figure 13:
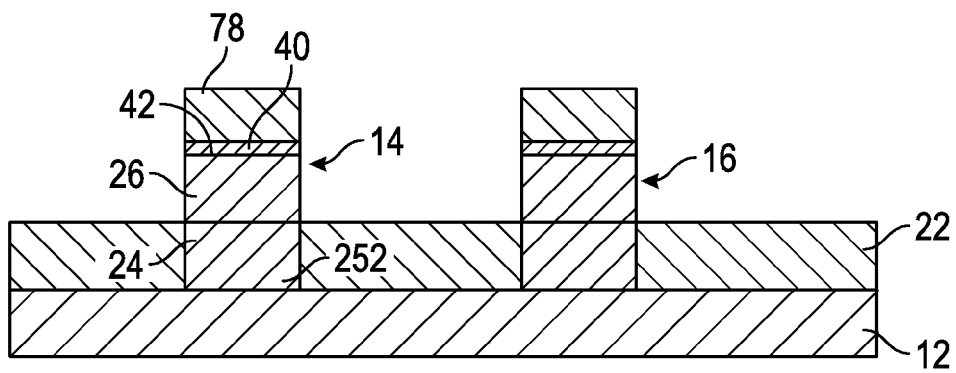

Referring to FIG. 13, the first insulator material is etched to the thickness that is less than the height of the first fin 14 to form the first insulator layer 22, with the first fin 14 extending through and protruding beyond the first insulator layer 22 to provide the buried fin portion 24 that is embedded within the first insulator layer 22 and the exposed fin portion 26 that protrudes beyond the first insulator layer 22. In this embodiment, the first insulator material may be etched to a depth of the doped region 252 of semiconductor material of the first fin 14 to form the first insulator layer 22.

Figure 14:
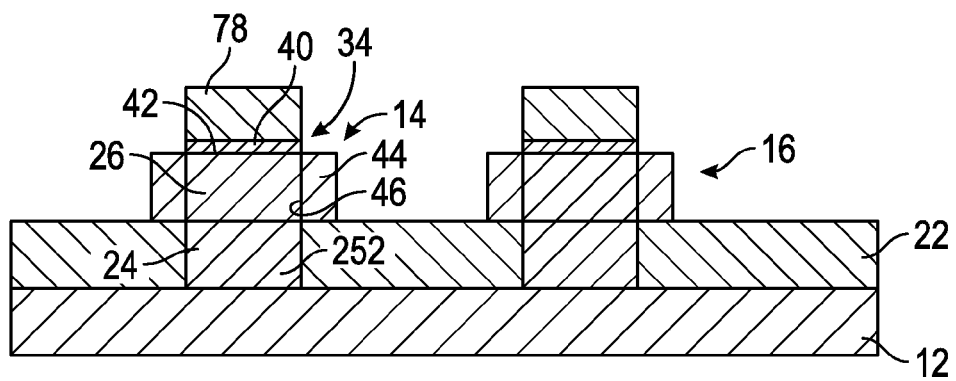

Referring to FIG. 14, after etching the first insulator layer, the second dielectric layer 244 is formed over sidewalls of the first fin 14. In particular, dielectric material of the second dielectric layer 244 may be deposited over the first insulator layer and the first fin 14, including over the hard mask 78 that is disposed over the first fin 14, followed by etching the dielectric material of the second dielectric layer 244 that is disposed on horizontal surfaces in the same manner as described above. Because the first dielectric layer 240 is formed prior to formation of the second dielectric layer 244 in this embodiment, no overlap exists between the first dielectric layer 240 and the second dielectric layer 244.

Optionally, although not shown, a dummy gate may be formed over the hard mask 78, the second dielectric layer 244, and the first insulator layer 22. The dummy gate may be formed from polycrystalline or amorphous silicon and enables conventional front-end-of-line (FEOL) logical FinFET processing and bitline/well tap formation while shielding locations where gate electrode structures are to be formed. Alternatively, it is to be appreciated that the methods described herein may be conducted through a gate-first technique, where the gate electrode structure 32 is formed prior to FEOL logical FinFET processing and bitline/well tap formation, in which case no dummy gate is formed.

Figure 15:
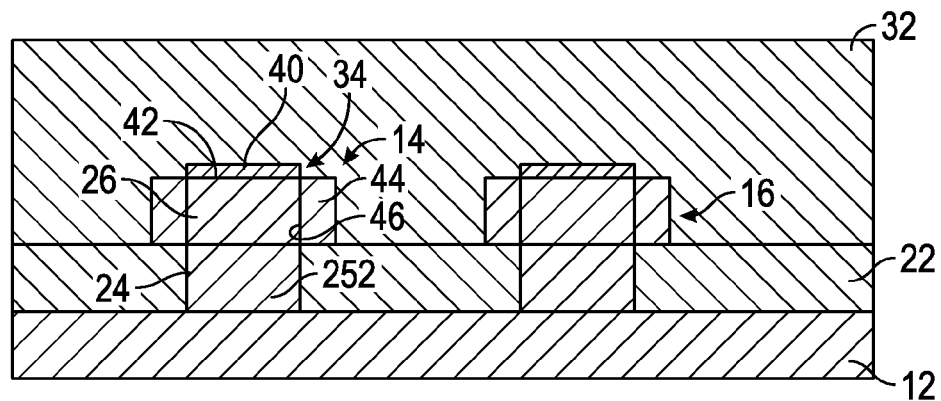

In an embodiment and as shown in FIG. 15, the hard mask 78 is removed from over the first fin 14 and any additional fins, such as by etching using an appropriate etchant, and the gate electrode structure 32 is formed over the first dielectric layer 240 and the second dielectric layer 244 with a potential breakdown path defined between the first fin 14 and the gate electrode structure 32 through the first dielectric layer 240. In an embodiment and as shown in FIG. 15, the gate electrode structure 32 wraps around the exposed fin portion 26, on three sides thereof, in accordance with conventional FinFET technology and as described above.

Figure 16:
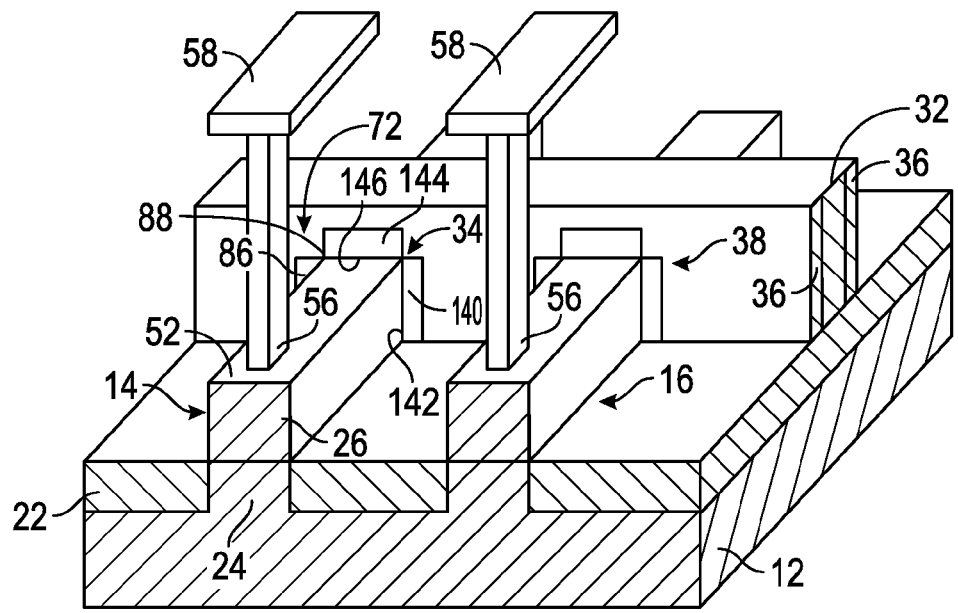
FIG. 16 is a schematic perspective view of a portion of a transistor device in accordance with another alternative embodiment.

Another embodiment of a transistor device 110 will now be described with reference to FIG. 16. In this embodiment, an alternative configuration of the transistor device 110 from the embodiments of FIGS. 1 and 10 is shown, including a different relative configuration for the first dielectric layer 140 and the second dielectric layer 144. All remaining structures of the transistor device 110 may be the same as described above for the embodiment of FIGS. 1 and 10. In this embodiment and as shown in FIG. 16, the first surface 142 of the first fin 14 over which the first dielectric layer 140 is disposed is a sidewall of the first fin 14, and the second dielectric layer 144 is disposed over a top surface 146 of the first fin 14 as the second surface 146. In this regard, the relative positions of the first dielectric layer 140 and the second dielectric layer 144 are switched from the embodiments of FIGS. 1 and 10. In this embodiment, the potential breakdown path is still defined through the first dielectric layer 140, but is located at the side of the first fin 14. Further in this embodiment, potential breakdown paths may be located on opposite sides of the first fin 14. In particular, in an embodiment, a third dielectric layer 86 that also includes the breakdown dielectric material overlies a third surface 88 of the first fin 14 on an opposite side of the first fin 14 from and parallel to the first surface 142 of the first fin 14 to provide another potential breakdown path defined between the first fin 14 and the gate electrode structure 32 through the third dielectric layer 86.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A transistor device having an anti-fuse configuration, the transistor device comprising:
   a semiconductor substrate comprising a first fin and a second fin extending parallel to the first fin;
   a first insulator layer overlying the semiconductor substrate and having a thickness less than a height of the first fin and the second fin, with the first fin and the second fin extending through and protruding beyond the first insulator layer to provide buried fin portions embedded within the first insulator layer and exposed fin portions protruding beyond the first insulator layer;
   a gate electrode structure overlying the exposed fin portions of the first fin and the second fin, wherein the gate electrode structure wraps around the exposed fin portions on three sides thereof; and
   a gate insulating structure disposed between the first fin and the gate electrode structure and between the second fin and the gate electrode structure, wherein the gate insulating structure comprises a first dielectric layer comprising a breakdown dielectric material overlying a first surface of the first fin and a first surface of the second fin, and a second dielectric layer different from the first dielectric layer overlying a second surface of the first fin and a second surface of the second fin, wherein a first potential breakdown path is defined between the first fin and the gate electrode structure through the first dielectric layer and a second potential breakdown path is defined between the second fin and the gate electrode structure through the second dielectric layer, and wherein the gate electrode structure is disposed over the first dielectric layer and the second dielectric layer, which insulate the first fin and the second fin from the gate electrode structure;
   wherein the second dielectric layer of the first fin and the second dielectric layer of the second fin are physically separate and spaced from each other with the gate electrode structure disposed therebetween.

2. The transistor device of claim 1, wherein the first dielectric layer is disposed transverse to the second dielectric layer.

3. The transistor device of claim 2, wherein the first dielectric layer at least partially overlies the second dielectric layer.

4. The transistor device of claim 2, wherein the first dielectric layer is absent over the second dielectric layer.

5. The transistor device of claim 1, wherein the second dielectric layer resists breakdown path formation.

6. The transistor device of claim 1, wherein the second dielectric layer is absent from the potential breakdown path defined between the first fin and the gate electrode structure through the first dielectric layer.

7. The transistor device of claim 1, wherein the first dielectric layer is thinner than the second dielectric layer to provide the potential breakdown path defined between the first fin and the gate electrode structure through the first dielectric layer.

8. The transistor device of claim 1, wherein the first fin and the second fin comprise a doped region of semiconductor material in the exposed fin portion, adjacent to the gate insulating structure.

9. The transistor device of claim 8, wherein the doped region of semiconductor material is interrupted by unaltered semiconductor material of the first fin and the second fin along a length thereof from one side of the gate insulating structure to another side of the gate insulating structure.

10. The transistor device of claim 9, further comprising a bit line connection in electrical communication with the doped region of semiconductor material in the exposed fin portion to form a connected source region, wherein a drain region of the doped region of semiconductor material is floated.

11. The transistor device of claim 1, wherein the first fin and the second fin comprise a doped region of semiconductor material in the buried fin portion, with unaltered semiconductor material of the first fin and the second fin disposed between the doped region of semiconductor material and the gate electrode structure.

12. The transistor device of claim 11, wherein the doped region of semiconductor material extends uninterrupted along a length of the first fin and the second fin from one side of the gate insulating structure to another side of the gate insulating structure.

13. The transistor device of claim 11, further comprising a bit line connection in electrical communication with the doped region of semiconductor material to form a connected source region for the first fin and the second fin.

14. The transistor device of claim 1, wherein at least one additional gate electrode structure overlies the exposed fin portion of the first fin and the second fin, and wherein all gate electrode structures overlying the first fin and the second fin are separated through a trench isolation structure.

15. The transistor device of claim 1, wherein the first surface of the first fin is further defined as a sidewall of the first fin, and wherein a third dielectric layer comprising breakdown dielectric material overlies a third surface of the first fin on an opposite side thereof and parallel to the first surface of the first fin to provide another potential breakdown path defined between the first fin and the gate electrode structure through the third dielectric layer.

16. A transistor device having an anti-fuse configuration, the transistor device comprising:
   a semiconductor substrate comprising a first fin and a second fin;
   a first insulator layer overlying the semiconductor substrate and having a thickness less than a height of the first fin and the second fin, with the first fin and the second fin extending through and protruding beyond the first insulator layer to provide buried fin portions embedded within the first insulator layer and exposed fin portions protruding beyond the first insulator layer;
   a gate electrode structure overlying the exposed fin portions of the first fin and the second fin, wherein the gate electrode structure wraps around the exposed fin portions of the first fin and the second fin on three sides thereof; and gate insulating structures disposed between the first fin and the gate electrode structure and between the second fin and the gate electrode structure, wherein the gate insulating structures comprise a first dielectric layer comprising a breakdown dielectric material overlying a first side of the respective fins and a second dielectric layer different from the first dielectric layer overlying a second side of the respective fins, wherein the first dielectric layer is thinner than the second dielectric layer to provide a potential breakdown path between the respective fins and the gate electrode structure through the first dielectric layer with the second dielectric layer absent from the potential breakdown path defined between the respective fins and the gate electrode structure through the first dielectric layer, and wherein the gate electrode structure is disposed over the first dielectric layer and the second dielectric layer, which insulate the first fin and the second fin from the gate electrode structure;

wherein the second dielectric layer of the first fin and the second dielectric layer of the second fin are physically separate and spaced from each other with the gate electrode structure sandwiched therebetween.

17. A method of forming a transistor device having an anti-fuse configuration, the method comprising:
   providing a semiconductor substrate comprising a first fin and a second fin extending parallel to the first fin;
   depositing a first insulator material overlying the semiconductor substrate;
   etching the first insulator material to form a first insulator layer having a thickness less than a height of the first fin and the second fin, with the first fin and the second fin extending through and protruding beyond the first insulator layer to provide buried fin portions embedded within the first insulator layer and exposed fin portions protruding beyond the first insulator layer;
   forming a first dielectric layer comprising a breakdown dielectric material over a first surface of the first fin and the second fin;
   forming a second dielectric layer over a second surface of the first fin and a second surface of the second fin, wherein the second dielectric layer is different from the first dielectric layer; and
   forming a gate electrode structure over the first dielectric layer and the second dielectric layer wherein the gate electrode structure wraps around the exposed fin portion of the first fin and the exposed fin portion of the second fin on three sides thereof, with a potential breakdown path defined between the first fin and the gate electrode structure through the first dielectric layer and with the gate electrode structure disposed over the first dielectric layer and the second dielectric layer, which insulate the first fin from the gate electrode structure, wherein the second dielectric layer of the first fin and the second dielectric layer of the second fin are physically separate and spaced from each other with the gate electrode structure disposed therebetween.

18. The method of claim 17, wherein forming the first dielectric layer comprises forming the first dielectric layer over the first surface of the first fin and the second fin after etching the first insulator material.

19. The method of claim 17, wherein forming the first dielectric layer comprises forming the first dielectric layer over the first surface of the first fin and the second fin prior to etching the first insulator material.

20. The transistor device of claim 1, wherein the second surface is a sidewall of the first fin and the second fin, and wherein the second dielectric layer overlies opposing sidewalls of the first fin the second fin.

* * * * *